United States Patent
Pan et al.

(10) Patent No.: US 6,881,675 B2
(45) Date of Patent: Apr. 19, 2005

(54) METHOD AND SYSTEM FOR REDUCING WAFER EDGE TUNGSTEN RESIDUE UTILIZING A SPIN ETCH

(75) Inventors: Jeng-Yang Pan, Taipei (TW); Chin-Te Huang, Hsin-Chu (TW); Chen-Yi Huang, Hsin Chu (TW); Sheng-Wen Chen, Taipei (TW)

(73) Assignee: Taiwan Semiconductor Manufacturing Co, Ltd., Hsin Chu (TW)

( * ) Notice: Subject to any disclaimer, the term of this patent is extended or adjusted under 35 U.S.C. 154(b) by 57 days.

(21) Appl. No.: 10/146,864

(22) Filed: May 15, 2002

(65) Prior Publication Data

US 2003/0216046 A1 Nov. 20, 2003

(51) Int. Cl.[7] .......................................... H01L 21/469
(52) U.S. Cl. ...................... 438/691; 438/704; 29/25.01
(58) Field of Search ............................... 438/697, 691, 438/704; 29/25.01

(56) References Cited

U.S. PATENT DOCUMENTS

| 5,510,652 A | * | 4/1996 | Burke et al. ............... 257/752 |
| 6,589,439 B2 | * | 7/2003 | Honda et al. ............... 216/107 |
| 6,589,855 B2 | * | 7/2003 | Miyamoto et al. .......... 438/464 |
| 2001/0006246 A1 | * | 7/2001 | Kwag et al. ................. 257/522 |
| 2003/0186553 A1 | * | 10/2003 | Bonsdorf et al. ........... 438/706 |

FOREIGN PATENT DOCUMENTS

WO     WO 02/35598 A1 * 5/2002      ......... H01L/21/321

* cited by examiner

*Primary Examiner*—Carl Whitehead, Jr.
*Assistant Examiner*—Ginette Peralta
(74) *Attorney, Agent, or Firm*—Tung & Associates

(57) ABSTRACT

A method and system for reducing wafer edge residue following a chemical mechanical polishing operation. A semiconductor wafer can be polished utilizing a chemical mechanical polishing apparatus. Thereafter, an acid etch operation may be performed to remove a residue, such as tungsten (W), collected on the semiconductor wafer as a result of the chemical mechanical polishing operation. A spin etch operation removes residue from the edges of the semiconductor wafer following chemical mechanical polishing of the semiconductor wafer.

16 Claims, 2 Drawing Sheets

METHOD AND SYSTEM FOR REDUCING WAFER EDGE TUNGSTEN RESIDUE UTILIZING A SPIN ETCH

TECHNICAL FIELD

The present invention relates generally to semiconductor fabrication methods and systems. The present invention also generally relates to chemical mechanical polishing devices and techniques thereof. The present invention additionally relates to methods and systems for removing residue from a semiconductor wafer.

BACKGROUND OF THE INVENTION

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes successively more non-planar. This occurs because the distance between the outer surface and the underlying substrate is greatest in regions of the substrate where the least etching has occurred, and least in regions where the greatest etching has occurred. With a single patterned underlying layer, this non-planar surface comprises a series of peaks and valleys wherein the distance between the highest peak and the lowest valley may be the order of 7000 to 10,000 Angstroms. With multiple patterned underlying layers, the height difference between the peaks and valleys becomes even more severe, and can reach several microns.

This non-planar outer surface presents a problem for the integrated circuit manufacturer. If the outer surface is non-planar, then photo lithographic techniques used to pattern photoresist layers might not be suitable, as a non-planar surface can prevent proper focusing of the photolithography apparatus. Therefore, there is a need to periodically planarize this substrate surface to provide a planar layer surface. Planarization, in effect, polishes away a non-planar, outer surface, whether conductive, semiconductive, or insulative, to form a relatively flat, smooth surface. Following planarization, additional layers may be deposited on the outer surface to form interconnect lines between features, or the outer surface may be etched to form vias to lower features.

Chemical mechanical polishing is one accepted method of planarization. This planarization method typically requires that the substrate be mounted on a carrier or polishing head, with the surface of the substrate to be polished exposed. The substrate is then placed against a rotating polishing pad. In addition, the carrier head may rotate to provide additional motion between the substrate and polishing surface. Further, a polishing slurry, including an abrasive and at least one chemically-reactive agent, may be spread on the polishing pad to provide an abrasive chemical solution at the interface between the pad and substrate.

Important factors in the chemical mechanical polishing process are: the finish (roughness) and flatness (lack of large scale topography) of the substrate surface, and the polishing rate. Inadequate flatness and finish can produce substrate defects. The polishing rate sets the time needed to polish a layer. Thus, it sets the maximum throughput of the polishing apparatus.

Each polishing pad provides a surface, which, in combination with the specific slurry mixture, can provide specific polishing characteristics. Thus, for any material being polished, the pad and slurry combination is theoretically capable of providing a specified finish and flatness on the polished surface. The pad and slurry combination can provide this finish and flatness in a specified polishing time. Additional factors, such as the relative speed between the substrate and pad, and the force pressing the substrate against the pad, affect the polishing rate, finish and flatness.

One of the problems encountered as a result of chemical mechanical polishing of semiconductor wafers is the collection of residue on the edges of the semiconductor wafers. In particular, residue readily collects on the rounded edges of a semiconductor wafer during a chemical mechanical polishing operation. In chemical mechanical operations, for example, in which tungsten (W) plugs are formed and W etchback steps are performed, W residue collects on the edges of the semiconductor wafer.

Due to the W material character, organic materials and water are easily attracted, resulting in the collection of W on the wafer surface. Such a situation generally can induce a very poor adhesion between IMD layers and passivation film. Subsequent alloy and polymide coating steps, including curing thereof, typically generate a very strong tensile stress, which tends to pull up the passivation and causes wafer edge polymide bubble formation and/or polymide peeling. This can in turn contaminate the pad area and follow-up packaging processes. Both conditions tend to deteriorate the reliability performance of the resulting semiconductor wafer devices.

Based on the foregoing, the present inventors have thus concluded that a need exists for a method and system which will reduce and/or eliminate wafer residue collected on a semiconductor wafer as a result of chemical mechanical polishing.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and system.

It is another aspect of the present invention to provide a method and system for removing residue from a semiconductor wafer.

It is yet another aspect of the present invention to provide a method and system for removing tungsten (W) residue from a semiconductor wafer.

It is still another aspect of the present invention to provide a method and system for removing residue from the edges of a semiconductor wafer following a chemical mechanical polishing (CMP) operation wherein residue is deposited on the semiconductor wafer.

The above and other aspects of the present invention can thus be achieved as is now described. A method and system for reducing wafer edge residue following a chemical mechanical polishing operation is disclosed herein. A semiconductor wafer can be polished utilizing a chemical mechanical polishing apparatus. Thereafter, an acid etch operation may be performed to remove a residue, such as tungsten (W), collected on the semiconductor wafer as a result of the chemical mechanical polishing operation.

The acid etch operation essentially involves a spin etch operation to remove the residue. Such a spin etch operation can be utilized to remove W residue from a semiconductor wafer, including a wafer edge. The acid utilized during the acid etch operation may comprise acids, such as, for example, $HNO_3$, HF, and/or $CH_3COOH$. Such an acid may be delivered to a backside of the semiconductor wafer. An $N_2$ gas flow may also be delivered to the semiconductor wafer to thereby produce a non-contact interface between the semiconductor wafer and a chuck. Residue acid vapor can be prevented from back-diffusion utilizing an $N_2$ nozzle.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
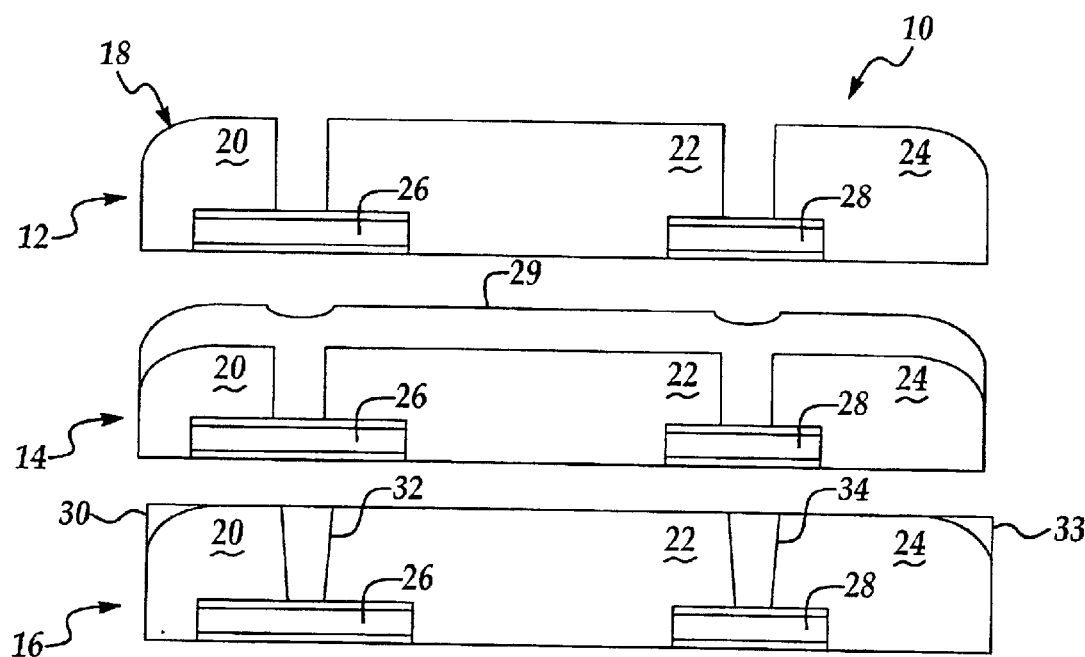
FIG. 1 depicts a prior art side sectional view of a process for collecting residue on a semiconductor wafer.

FIG. 1 depicts a prior art side sectional view 10 of a process for collecting residue on a semiconductor wafer, in accordance with a preferred embodiment of the present invention. As illustrated in FIG. 1, three process steps are illustrated, including a first process step 12, a second process step 14, and a third process step 16.

First process step 12 illustrates an initial step in which a semiconductor wafer is prepared for chemical mechanical polishing. A semiconductor wafer includes an intermetal dielectric (IMD) layer comprising a first section 10, a second section 22 and a third section 24. Respective first, second, and third sections 10, 22, and 24 together comprise the IMD layer. A metal layer comprising metal layers 26 and 28 is generally located below the IMD layer. Specifically note rounded wafer edges 18 and 19.

Second process step 14 illustrates the actual chemical mechanical polishing operation. A layer 29 is situated above respective first, second and third sections 10, 22 and 24. Following processing of the chemical mechanical polishing operation, as indicated in third process step 16, plug formations 32 and 34 respectively are formed above metal layers 25 and 28.

A residue 30 and 33 is thus collected upon the rounded wafer edges 19 and 19 as a result of the chemical mechanical polishing operation. Such a residue can be, for example, tungsten (W), or another metal, such as, aluminum and/or $Ti/(Ta_2O_5)$. Plug formations 32 and 34 can comprise, for example, W plug formations.

Due to the material character of metals, such as W, organic materials and water can be attracted to the W metal, thereby collecting W residue on the wafer surface and/or edge of the semiconductor wafer as a result of the chemical mechanical polishing operation. Thus, a very poor adhesion is induced between the IMD layer (i.e., first, second and third sections 20, 22, and 24) and passivation film.

Figure 2:
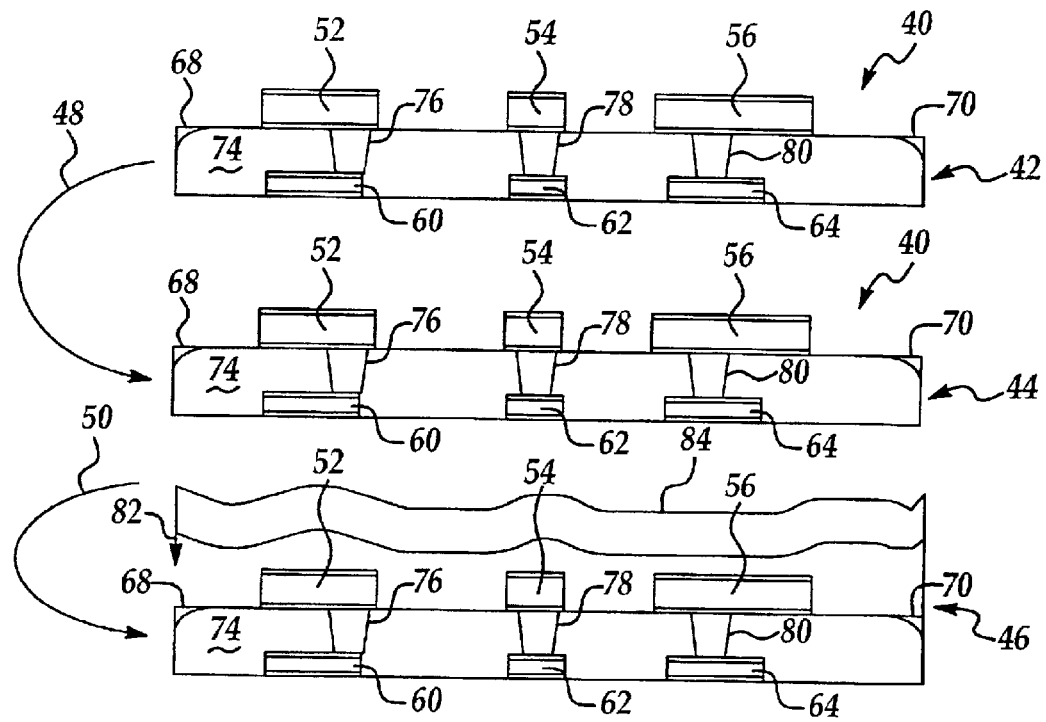
FIG. 2 illustrates a prior art side sectional view of a wafer edge peeling process.

FIG. 2 illustrates a side sectional view 40 of a wafer edge peeling process, in accordance with a preferred embodiment of the present invention. FIG. 2 depicts a three step wafer edge peeling process, comprising a first process step 42, a second process step 44 and a third process step 46. Residue 68 and 70 collects on the edges of a semiconductor wafer that includes an IMD layer 74 and plug formations 76, 78 and 80.

A metal 5 layer (i.e., metal layers 60, 62 and 64) is located respectively below plug formations 76, 78 and 80. A metal 6 layer (i.e., metal layers 52, 54 and 56) is located respectively above plug formations 76, 78, and 80. Note that in process steps 42, 44 and 46, similar or analogous parts are indicated by identical reference numerals. IMD layer 74 is thus analogous to the IMD layer depicted in FIG. 1.

Recall that the IMD layer illustrated in FIG. 1 comprises first, second and third sections 20, 22, and 24. Additionally residue 68 and 70 of FIG. 2 is analogous to residue 18 and 19 of FIG. 1. An alloy process is indicated by arrow 48, while a grinding process is indicated by arrow 50 in FIG. 2. The alloy process leads to second process step 44, while the grinding process generally takes place during third process step 46.

As indicated in third process step 46, following the alloy process, a polymide coating 84 is deposited to peel away the residue 68 and 70 that collected on the edges of the semiconductor wafer. As a result of the alloy process and the grinding process, a strong tensile stress is generated to pull up the passivation and cause wafer edge polymide bubble or polymide peeling. This can lead to contamination of the pad area and follow-up packaging processes. Both conditions tend to deteriorate the reliability performance of resulting semiconductor devices.

Figure 3:
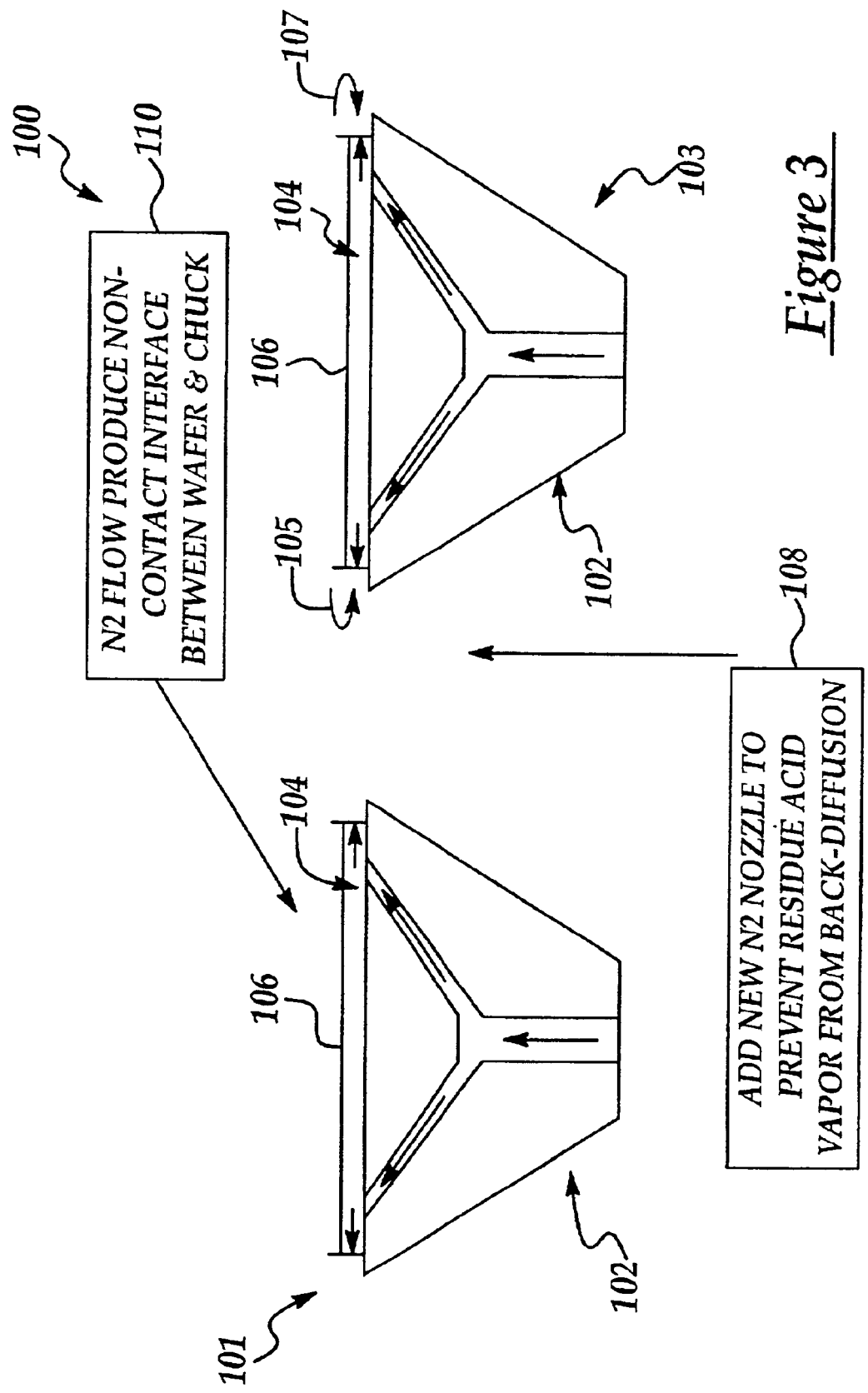
FIG. 3 depicts a block diagram illustrating utilization of a backside etch to remove residue, in accordance with a preferred embodiment of the present invention.

FIG. 3 depicts a block diagram 100 illustrating utilization of a backside etch to remove residue, in accordance with a preferred embodiment of the present invention. Block diagram 100 further includes two process steps, including a first process step 101 and a second process step 103. As indicated in first process step 101, a semiconductor wafer 104 is located above a chuck 102.

As illustrated at block 110, an $N_2$ gas flow may be delivered to the semiconductor wafer 104 to thereby produce a non-contact interface between the semiconductor wafer 104 and chuck 102. As indicated in second process step 103, semiconductor wafer 104 can undergo a spin etch, as indicated by arrows 105 and 107 to remove residue collected on the semiconductor wafer as a result of a prior chemical mechanical polishing operation. Thus, the configuration illustrated in FIG. 3 addresses the problems (i.e., collection of residue) indicated in FIGS. 1 and 3 herein. Additionally, as illustrated at block 108, $N_2$ nozzle may be utilized to prevent residue acid vapor from back diffusion.

Based on the foregoing, it can be appreciated that the present invention disclosed herein thus describes a method and system for reducing wafer edge residue following a chemical mechanical polishing operation. The semiconductor wafer 104 can be polished utilizing a chemical mechanical polishing apparatus. Thereafter, an acid etch operation may be performed to remove a residue, such as tungsten (W), collected on semiconductor wafer 14 as a result of the chemical mechanical polishing operation.

The acid etch operation essentially involves a spin etch operation to remove the residue. Such a spin etch operation (i.e., see arrows 105 and 107) can be utilized to remove W residue from semiconductor wafer 104, including the edge of semiconductor wafer 104. In addition, maintaining proper control of the wafer edge, as indicated in FIG. 3, will permit few deteriorating impacts on other dies. The spin etch operation occurs after the CMP operation. In scenarios involving W, for example, the spin etch operation removes the W residue from the wafer edge, which the CMP operation is unable to accomplish.

The acid utilized during the acid etch operation may comprise acids, such as, for example, $HNO_3$, HF, and/or $CH_3COOH$. Such an acid may be delivered to backside 106 of semiconductor wafer 104. An $N_2$ gas flow may also be delivered to the semiconductor wafer to thereby produce a non-contact interface between the semiconductor wafer and a chuck. Residue acid vapor can be prevented from back-diffusion utilizing an $N_2$ nozzle. The present invention solves the poor adhesion between the IMD layer and passivation film that results from CMP processes and also avoids the follow-up polymide peeling (i.e., see FIG. 2) that is caused by thermal stresses resulting from alloy and curing processes.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above reaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for reducing wafer edge residue following a chemical mechanical polishing operation, said method comprising the steps of:

polishing a semiconductor wafer utilizing a chemical mechanical polishing apparatus, wherein chemical mechanical polishing thereof can result in a poor adhesion between at least one IMD layer and a passivation film formed upon said semiconductor wafer;

thereafter performing an acid etch operation to remove a residue collected on said semiconductor wafer as a result of said chemical mechanical polishing operation;

delivering an $N_2$ gas flow to said semiconductor wafer using a first nozzle to produce a non-contact interface between said semiconductor wafer and a chuck, thereby preventing said poor adhesion between said at least one IMD layer said passivation film resulting from said chemical mechanical polishing and avoiding follow-up polymide peeling caused by thermal stresses resulting from alloy and curing of said semiconductor wafer; and delivering an $N_2$ gas flow adjacent to said semiconductor wafer using a second nozzle to prevent residue acid vapor from back-diffusion.

2. The method of claim 1 wherein said residue comprises a tungsten residue.

3. The method of claim 1 wherein the step of performing an acid etch operation to remove said residue collected on said semiconductor wafer as a result of said chemical mechanical polishing operation, further comprises the step of:

performing an etching operation to remove said residue collected on said semiconductor wafer as a result of said chemical mechanical polishing operation.

4. The method of claim 1 wherein the step of performing an acid etch operation to remove a residue collected on said semiconductor wafer as a result of said chemical mechanical polishing operation, further comprises the step of:

performing an $HNO_3$ acid etch operation to remove said residue collected on said semiconductor wafer as a result of said chemical mechanical polishing operation.

5. The method of claim 1 wherein the step of performing an acid etch operation to remove a residue collected on said semiconductor wafer as a result of said chemical mechanical polishing operation, further comprises the step of: performing an HF acid etch operation to remove said residue collected on said semiconductor wafer as a result of said chemical mechanical polishing operation.

6. The method of claim 1 wherein the step of performing an acid etch operation to remove a residue collected on said semiconductor wafer as a result of said chemical mechanical polishing operation, further comprises the step of:

performing a $CH_3COOH$ acid etch operation to remove said residue collected on said semiconductor wafer as a result of said chemical mechanical polishing operation.

7. The method of claim 1 wherein the step of performing an acid etch operation to remove a residue collected on said semiconductor wafer as a result of said chemical mechanical polishing operation, further comprises the step of:

delivering an acid to a backside of said semiconductor wafer.

8. The method of claim 1 further comprising the step of: controlling said semiconductor wafer during said acid etch operation in order to maintain proper control of an edge of said semiconductor wafer.

9. A method for reducing wafer edge residue following a chemical mechanical polishing operation, said method comprising the steps of:

polishing a semiconductor wafer utilizing a chemical mechanical polishing apparatus;

thereafter performing an $HNO_3$ acid etch operation to remove a residue collected on said semiconductor wafer as a result of said chemical mechanical polishing operation, wherein said $HNO_3$ acid etch operation comprises a spin etch operation;

thereafter delivering an $N_2$ gas flow to said semiconductor wafer using a first $N_2$ nozzle to thereby produce a non-contact interface between said semiconductor wafer and a chuck; and thereafter preventing a residue acid vapor from back-diffusion utilizing an a second $N_2$ nozzle adjacent to said semiconductor wafer.

10. The method of claim 9 wherein said residue comprises a tungsten residue.

11. The method of claim 9 further comprising the step of depositing a polymide coating upon said semiconductor wafer in order to peel away a residue collected on at least one edge of said semiconductor wafer.

12. The method of claim 9 wherein the step of performing an $HNO_3$ acid etch operation to remove a residue collected on said semiconductor wafer as a result of said chemical mechanical polishing operation, further comprises the step of: delivering said $HNO_3$ acid to a backside of said semiconductor wafer.

13. A method for reducing wafer edge residue following a chemical mechanical polishing operation, said method comprising the steps of:

polishing a semiconductor wafer utilizing a chemical mechanical polishing apparatus;

thereafter performing a $CH_3COOH$ acid etch operation to remove said residue collected on said semiconductor wafer as a result of said chemical mechanical polishing operation;

thereafter delivering an $N_2$ gas flow to said semiconductor wafer using a first $N_2$ nozzle to thereby produce a non-contact interface between said semiconductor wafer and a chuck; and thereafter preventing a residue acid vapor from back-diffusion utilizing a second $N_2$ nozzle adjacent to said semiconductor wafer.

14. The method of claim 13 wherein said residue comprises a tungsten residue.

15. The method of claim 13 further comprising the step of depositing a polymide coating upon said semiconductor wafer in order peel away a residue collected on at least one edge of said semiconductor wafer.

16. The method of claim 13 wherein the step of performing an $CH_3COOH$ acid etch operation to remove a residue collected on said semiconductor wafer as a result of said chemical mechanical polishing operation, further comprises the step of: delivering said $CH_3COOH$ acid to a backside of said semiconductor wafer.

* * * * *